(12) United States Patent
Hellwig et al.

(10) Patent No.: US 8,901,420 B2
(45) Date of Patent: Dec. 2, 2014

(54) HOUSING FOR A CONNECTING UNIT

(75) Inventors: Simon Hellwig, Hannover (DE); Christian Schuschan, Langenhagen (DE); Arne Stephan, Sehnde (DE)

(73) Assignee: WABCO GmbH, Hannover (DE)

( * ) Notice: Subject to any disclaimer, the term of this patent is extended or adjusted under 35 U.S.C. 154(b) by 573 days.

(21) Appl. No.: 13/003,671

(22) PCT Filed: Apr. 23, 2009

(86) PCT No.: PCT/EP2009/002949
§ 371 (c)(1),
(2), (4) Date: Apr. 15, 2011

(87) PCT Pub. No.: WO2010/012324
PCT Pub. Date: Feb. 4, 2010

(65) Prior Publication Data
US 2011/0180296 A1 Jul. 28, 2011

(30) Foreign Application Priority Data
Jul. 29, 2008 (DE) .................. 10 2008 035 328

(51) Int. Cl.
H01R 13/46 (2006.01)
H02G 3/08 (2006.01)
H05K 5/02 (2006.01)
H05K 5/00 (2006.01)

(52) U.S. Cl.
CPC ............... H05K 5/0252 (2013.01); *H02G 3/08* (2013.01); *H01R 13/46* (2013.01); *H05K 5/00* (2013.01); *H01R 13/465* (2013.01)

USPC ............... 174/59; 174/50; 220/3.2; 220/3.3; 439/535; 439/491; 439/488

(58) Field of Classification Search
CPC ......... H02G 3/08; H02G 3/081; H02G 3/083; H02G 3/22; H02G 3/26; H02G 3/28; H02G 3/30; H05K 5/00; H05K 5/02; H05K 5/0252; H05K 5/0247; F16L 41/03; H01R 13/46; H01R 13/465; H01R 13/50
USPC ...... 174/50, 59, 650, 53, 57, 17 R, 520, 68.1; 220/3.2, 3.3, 4.02; 439/535, 491, 488, 439/949; 285/125.1, 126.1, 129.1, 133.11, 285/133.3
See application file for complete search history.

(56) References Cited

U.S. PATENT DOCUMENTS

| | | | | |
|---|---|---|---|---|
| 982,535 | A | * | 1/1911 | Rudkiewicz .................... 220/3.2 |
| 2,640,619 | A | * | 6/1953 | Schneiderman ............... 220/3.2 |
| 2,861,705 | A | * | 11/1958 | Scott ............................... 220/3.9 |

(Continued)

FOREIGN PATENT DOCUMENTS

| | | |
|---|---|---|
| DE | 297 04 288 U1 | 6/1997 |
| DE | 101 43 266 A1 | 4/2003 |

(Continued)

*Primary Examiner* — Angel R Estrada
(74) *Attorney, Agent, or Firm* — Kramer Levin Naftalis & Frankel LLP

(57) ABSTRACT

A housing for a connecting unit, particularly an electronic unit, includes at least one plug connector having a plug axis. The housing also includes a strip. The longitudinal axis of the strip is in a spatial plane with the plug axis of the plug connector.

22 Claims, 8 Drawing Sheets

(56) References Cited

U.S. PATENT DOCUMENTS

| | | | |
|---|---|---|---|
| 4,165,443 A * | 8/1979 | Figart et al. | 174/53 |
| 5,775,935 A * | 7/1998 | Barna | 439/491 |
| 6,201,187 B1 * | 3/2001 | Burbine | 174/60 |
| 6,527,302 B1 * | 3/2003 | Gault et al. | 174/50 |
| 6,861,585 B1 * | 3/2005 | Kiely | 174/50 |
| 7,201,585 B2 | 4/2007 | Pirner et al. | |
| 7,259,337 B1 * | 8/2007 | Gretz | 174/50 |
| 7,371,107 B2 * | 5/2008 | Deng | 439/491 |
| 7,446,266 B1 * | 11/2008 | Gretz | 174/50 |
| 7,504,580 B2 * | 3/2009 | Lammens et al. | 174/50 |
| 8,242,386 B1 * | 8/2012 | Baldwin et al. | 174/50 |
| 2007/0238352 A1 | 10/2007 | Deng | |

FOREIGN PATENT DOCUMENTS

| | | |
|---|---|---|
| DE | 102 43 313 B4 | 4/2004 |
| DE | 198 01 006 A1 | 7/2009 |
| EP | 1 464 880 A1 | 10/2004 |
| WO | WO 2004/060723 | 7/2004 |

* cited by examiner

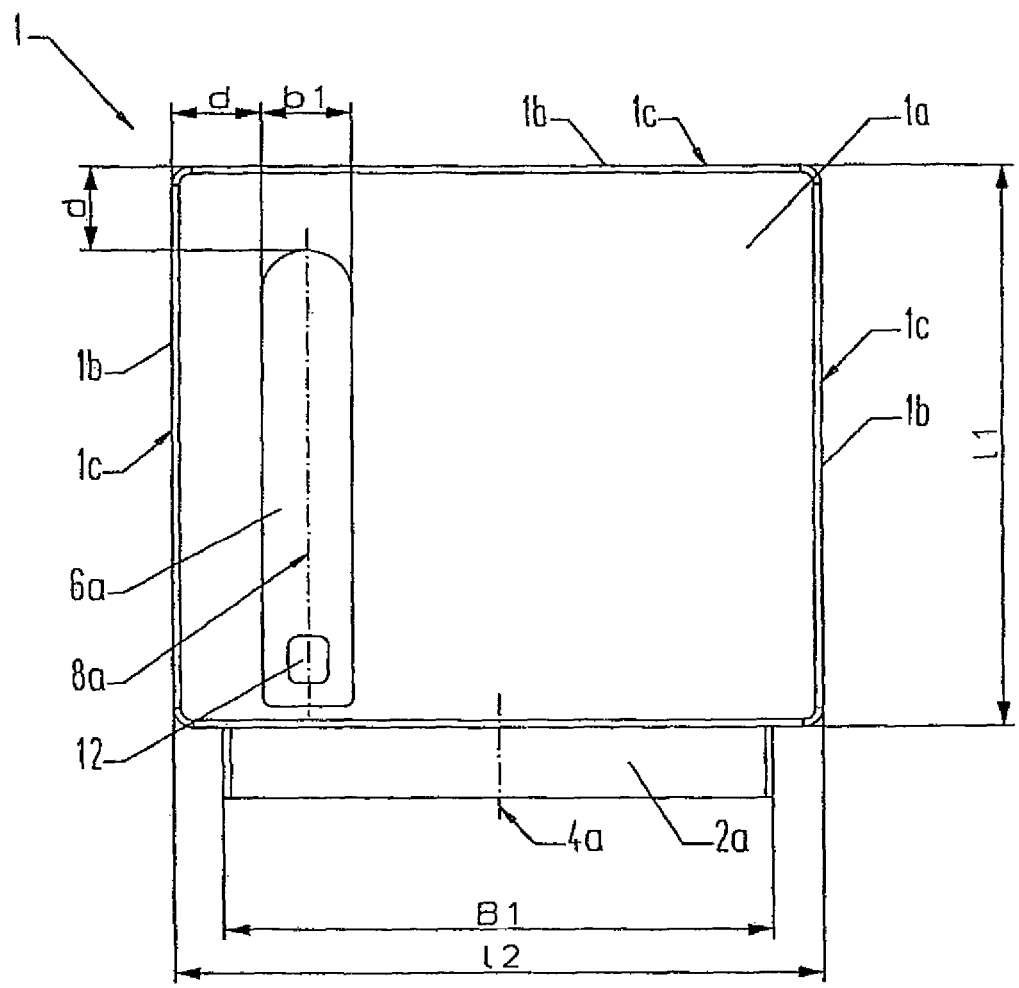

HOUSING FOR A CONNECTING UNIT

FIELD OF THE INVENTION

The present invention generally relates to embodiments of a housing for a connecting unit, in particular an electronic unit, having at least one plug connector having a plug axis.

BACKGROUND OF THE INVENTION

Known electronic units have one or more plug connectors for connecting the units to sensors, actuators and/or indicator systems. The plug connectors are often not marked, making it impossible to ensure against incorrect connection if there are similar plug connectors on an electronic unit.

SUMMARY OF THE INVENTION

Generally speaking, it is therefore an object of the present claimed invention to provide a housing for an electronic unit with which the possibility of connecting the plug connector to the correct mating part on a connection member is simplified and/or improved by simple and economical means.

The object is achievable by providing a housing having a first strip, a first longitudinal axis of the first strip being disposed in a spatial plane with the first plug axis of the first plug connector. The ease with which the "correct" plug connector for the corresponding connection member, e.g., a data bus connection, a sensor, an actuator and/or an indicator system, can be located is significantly improved by the first strip, and the orientation or extent of the first strip indicates the direction of motion for the connection member to be connected to the plug connector and hence facilitates or ensures correct connection.

The first strip facilitates visual perception of the disposition of the plug connector and guides the operator wishing to connect the plug connector to the connection member quickly and directly to the "correct" plug connector.

Another advantage lies in the fact that the first strip can be mounted economically in or on the surface of the housing of the electronic unit. In particular, the first strip can be integrated into the surface of the housing and hence be connected in one piece to the housing. This means that an additional component is not required for the first strip.

In one embodiment of the present invention, the housing has a second plug connector with a second plug axis and a second strip, a second longitudinal axis of the second strip being disposed in a spatial plane with the second plug axis of the second plug connector. Advantageously, the operator can also locate the second plug connector easily, quickly and directly with the aid of the second strip and connect it correctly to the relevant connection member. It is equally advantageous that the second strip can be mounted economically in or on the surface of the housing of the electronic unit or integrated into the surface of the housing, thus eliminating the need for an additional component for the second strip.

According to another embodiment, the housing has a third plug connector with a third plug axis and a third strip, a third longitudinal axis of the third strip being disposed in a third spatial plane with the third plug axis of the third plug connector. Advantageously, the operator can also locate the third plug connector easily, quickly and directly with the aid of the third strip and connect it correctly to the relevant connection member. It is equally advantageous that the third strip can be mounted economically in or on the surface of the housing of the electronic unit or integrated into the surface of the housing, thus eliminating the need for an additional component for the third strip.

According to a further embodiment, the first, second and/or third strip can have a different surface finish than that of the housing surface. The advantage of this is that perception—especially visual perception—of the relevant strip relative to the housing surface of the electronic unit is enhanced. For example, the surface finish of the strip or the relevant strips can be made smoother than the housing surface, and this would correspond to a lower Rz or Ra value of the strip than the Rz or Ra value of the housing surface. On the other hand, it is also possible to make the surface finish of the strip rougher than the housing surface, and this would correspond to a higher Rz or Ra value of the strip than the Rz or Ra value of the housing surface.

According to yet another embodiment, the strip is recessed relative to the housing surface. This significantly enhances the visual perceptibility of the strip relative to the remainder of the housing surface. This also provides perception by feel or touch, which can facilitate and render more reliable the connection of the plug connector to a mating part on the connection member where the locations for the installation of the housing in a vehicle are accessible only with difficulty.

According to a further embodiment, the strip is raised relative to the housing surface. This significantly enhances the visual perceptibility of the strip relative to the remainder of the housing surface. This also provides perception by feel or touch, which can facilitate and render more reliable the connection of the plug connector to a mating part on the connection member where the locations for the installation of the housing in a vehicle are accessible only with difficulty.

In another embodiment, the first, second and/or third strip can have a legend. It is particularly advantageous if the legend includes the indication of the function of the corresponding plug connector or also information on the manufacturer. Advantageously, an identical plug connector, which can be produced economically as a mass produced item, can be used for the first, second and/or third plug connector, since incorrect connection of the respective plug connector can be largely avoided by means of the strip or strips and the legend in or on the strips.

In the embodiment of a strip disposed in a recessed manner, the legend can be disposed in a manner raised relative to the strip surface, e.g., at the maximum as far as the limit of the housing surface. This enhances visibility and makes it easier to feel and hence improves recognition of the legend and of the strip and protects the legend from wear or damage due to external influences.

According to another embodiment, the first, second and/or third strip can be disposed parallel to one another. As a result, all the mating parts on the connection members of the corresponding plug connectors have the same direction of insertion, and this is easily identifiable.

In a further embodiment, the first, second and/or third strip can be disposed perpendicularly to the first, second and/or third plug axis. This means that it is also possible to dispose a corresponding strip on the housing surface to which a plug connector is oriented perpendicularly with its plug axis.

In a still further embodiment, the first, second and/or third strip can be disposed so as to start from the first, second and/or third plug connector and to extend as far as an outline edge of the housing surface. This means that, in terms of its extent, the respective strip fully utilizes the length of the housing and extends from the corresponding plug connector as far as the outline edge of the housing surface, thus enhancing the identifiability of the strip.

According to an additional embodiment, the width (b1, b2, b3) of the first, second and/or third strip corresponds at the maximum to the width (B1, B2, B3) of the first, second and/or third plug connector. As a result, it is possible to infer the width of the associated plug connector from the width of the strip and vice versa, and this facilitates the identification of the associated plug connector by means of the respective strip.

In a further embodiment, the first, second and/or third strip can be the same width (b1, b2, b3). This enhances the locatability of the strips. The equality between the widths of the individual strips can also indicate that the associated plug connectors have the same function. Another advantage is that no greater significance is given to any strip over one or more of the other strips through having a different width, i.e., being wider, or being set back, i.e., narrower. Quick and easy location of all the plug connectors is nevertheless ensured by means of an associated strip, thus eliminating the possibility that the user will, through an oversight, forget to make contact with any of the plug connectors.

According to another embodiment, the width (b1, b2, b3) of the first, second and/or third strip corresponds at the maximum to the minimum width (B1, B2, B3) of the first, second and/or third plug connector. As a result, there remains sufficient housing surface between the individual strips, thus making the individual strips easier to identify and distinguish.

In another embodiment, the first, second and/or third strip can be disposed perpendicularly to the housing side with the higher number of plug connectors. As a result, the strip or strips start from the plug connectors on the housing side with the highest number of plug connectors, thus allowing a higher or the maximum number of strips on the housing surface. This allows enhanced identifiability of the plug connectors by means of the associated strips.

In a further embodiment, the first, second and/or third strip can be disposed perpendicularly to the housing side with the greater width (B1, B2, B3) of the first, second and/or third plug connectors. The wider plug connectors allow for a greater width of the associated strips; a wider strip being more easily identifiable and better accommodating the legend.

In yet another embodiment, the first, second and/or third strip can be disposed parallel to the longest housing side. As a result, the respective strip or strips are as long as possible, thus enhancing identifiability and facilitating and improving the accommodation of a legend within the strip.

In a still further embodiment, the first strip can be disposed asymmetrically on the housing. Plug connectors are often very wide, extending over almost the entire width of the housing. This means that the first strip is less than the width of the first plug connector, and, as a result, the first strip takes up or fills only part of the housing surface and is therefore clearly delimited from the housing surface, enhancing and improving the identifiability of the first strip.

According to an additional embodiment, the first strip is at a defined and constant distance from the outline edges of the housing, enhancing and improving the identifiability and distinguishing effect of the first strip in relation to the housing surface.

In a further embodiment, the predefined distance of the first strip from the outline edges of the housing surface corresponds to the width (b1) of the first strip. This improves the identifiability of the strip on the housing surface.

It should be appreciated that the present invention is not restricted to the use of a first, second and/or third strip on the housing surface of an electronic unit but also applies mutatis mutandis to a possible fourth, fifth, sixth strip etc. with a corresponding number of plug connectors. The embodiments of the invention also apply mutatis mutandis to these further possible strips.

Moreover, the inventive embodiments can also be employed with housings for pneumatic units, such as brake valves or brake modulators. In this case, the plugs are embodied as pneumatic plug connectors and the respective strip identifies the respective pneumatic plug connector and the direction of insertion thereof. Also, the embodiments and variants of the strips according to the invention can be applied mutatis mutandis to a connecting unit embodied as a pneumatic unit with an appropriately designed housing.

Still other objects and advantages of the present invention will in part be obvious and will in part be apparent from the specification.

The present invention accordingly comprises the features of construction, combination of elements, and arrangement of parts all as exemplified in the constructions herein set forth, and the scope of the invention will be indicated in the claims.

BRIEF DESCRIPTION OF THE DRAWINGS

Illustrative embodiments and further advantages of the invention are explained in greater detail hereinafter with reference to the appended drawing figures, in which:

FIG. 3 is a housing with one strip according to an exemplary embodiment of the present invention;

DETAILED DESCRIPTION OF THE PREFERRED EMBODIMENTS

Figure 1:
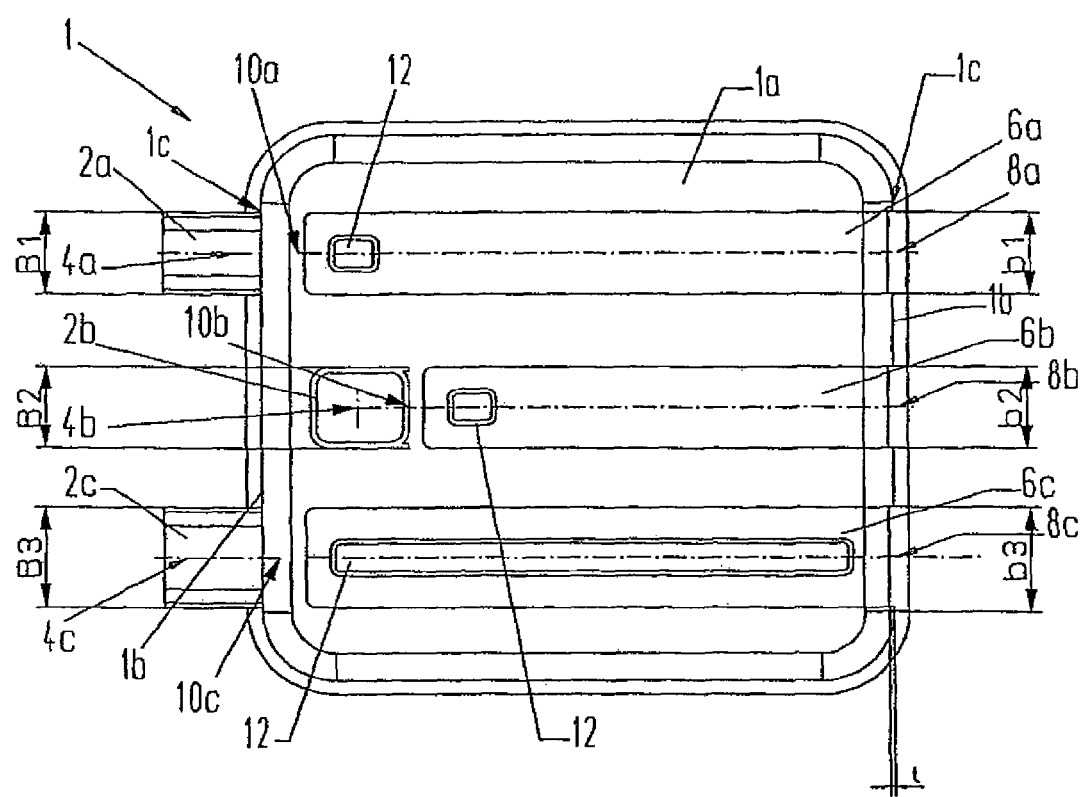
FIG. 1 is a plan view of a housing with three strips in accordance with an exemplary embodiment of the present invention.

FIG. 1 shows a housing (1) for a connecting unit. The connecting unit can be designed as an electronic unit or as a pneumatic unit. The housing (1) has a first plug connector (2a) with a first plug axis (4a), a second plug connector (2b) with a second plug axis (4b) and a third plug connector (2c) with a third plug axis (4c). In this illustrative embodiment, the second plug connector (2b) and the second plug axis (4b) are disposed perpendicularly to the first plug connector (2a) and the first plug axis (4a) and perpendicularly to the third plug connector (2c) and the third plug axis (4c) and perpendicularly to the housing surface (1a).

A first longitudinal axis (8a) of a first strip (6a) is disposed parallel to the first plug axis (4a), these parts being at a predetermined distance (not shown) from one another, with the result that the first plug axis (4a) and the first longitudinal axis (8a) form a first spatial plane (10a).

The first longitudinal axis (8a) forms the center line of the first strip (6a), which is disposed in the region of the housing surface (1a) and is continued in part at the housing side (1c). Starting from the housing side (1c), the first strip (6a) is disposed on the plug (2a) so as to extend in the direction of the first longitudinal axis (8a) as far as the outline edge (1b) or housing side (1c) of the opposite housing side (1c). The first strip (6a) has a legend (12) or an area for a legend (12). The legend (12) can be disposed in part of the first strip (6a) or can be formed over the entire length of the first strip (6a). The outline edge (1b) is formed by the line of intersection of the plane of the housing surface (1a) and the plane of the housing side (1c), it being possible for the outline edge (1b) to have a radius. The first strip (6a) has a width (b1) which is less than or equal to the width (B1) of the first strip (2a).

The second plug axis (4b), which forms the center line of the second plug (2b), is oriented perpendicularly to the second longitudinal axis (8b) of the second strip (6b), with the result that a second spatial plane (10b) is formed by these two axes (4b, 8b). The second strip (6b) also has a legend (12). Starting from the second plug connector (2b), which is disposed on the housing surface (1a), the second strip (6b) is formed so as to extend as far as one outline edge (1b) of the housing (1) and is continued in part at the housing side (1c). The width (b2) of the second strip (6b) is less than or equal to the width (B2) of the second plug connector (6b).

The third plug connector (2c) is disposed on the same housing side (1c) as the first plug connector (2a). The third plug axis (4c) of the third plug connector (2c) is disposed parallel to the first plug axis (4a) of the first plug connector (2a). The third plug axis (4c) is likewise disposed parallel to the third longitudinal axis (8c) of the third strip (6c) and, here too, there is a predetermined distance between the two axes (4c and 8c), with the result that the third plug axis (4c) and the third longitudinal axis (8c) form a third spatial plane (10c). The legend (12) within the third strip (6c) has approximately the same length on the housing surface (1a) as the third strip (6c).

The first strip (6a), the second strip (6b) and the third strip (6c) are recessed relative to the housing surface (1a) by the depth (t). The continuation of the first strip (6a), of the second strip (6b) and of the third strip (6c) at the housing side (1c) is likewise recessed relative to the surface of the housing side (1c) by the depth (t). It is also possible to dispose the first strip (6a), the second strip (6b) and/or the third strip (6c) at different depths (t) relative to the housing surface (1a) and the surface of the housing side (1c) or to reduce the depth (t) to the value zero. The surface finish of the first strip (6a), the second strip (6b) and/or the third strip (6c) is preferably different, in particular rougher or less rough, than the housing surface (1a) and/or the surface of the housing side (1c).

Figure 2A:
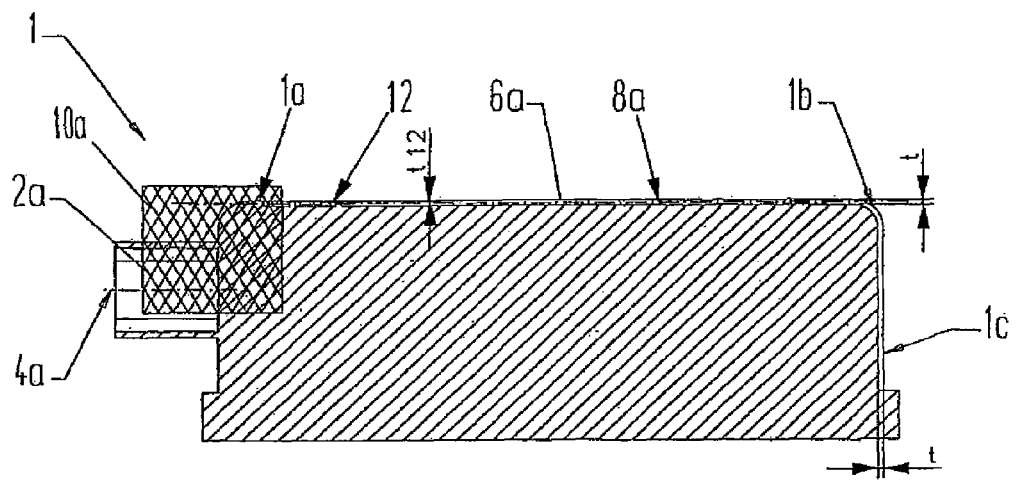
FIG. 2a is a sectional representation of the embodiment of the housing depicted in FIG. 1.

FIG. 2a shows a sectional representation through the housing (1) in FIG. 1 in the region of the first spatial plane (10a). The first plug axis (4a) and the first longitudinal axis (8a) have a predetermined difference in level or are at a predetermined distance relative to one another and are disposed parallel to one another. The first strip (6a) is disposed in a manner recessed relative to the housing surface (1a) of the housing (1) by the depth (t). The legend (12) within the first strip (6a) is recessed relative to the housing surface (1a) by the depth (t12) of the legend in order to protect the legend more effectively against damage or the like. Part of the first strip (6a) is continued beyond the outline edge (1b) at the housing side (1c). The first strip (6a) also has a depth (t) relative to the surface of the housing side (1c) at the housing side (1c). It is also possible to dispose the legend (12) in the region of the first strip (6a) at the housing side (1c).

Figure 2B:
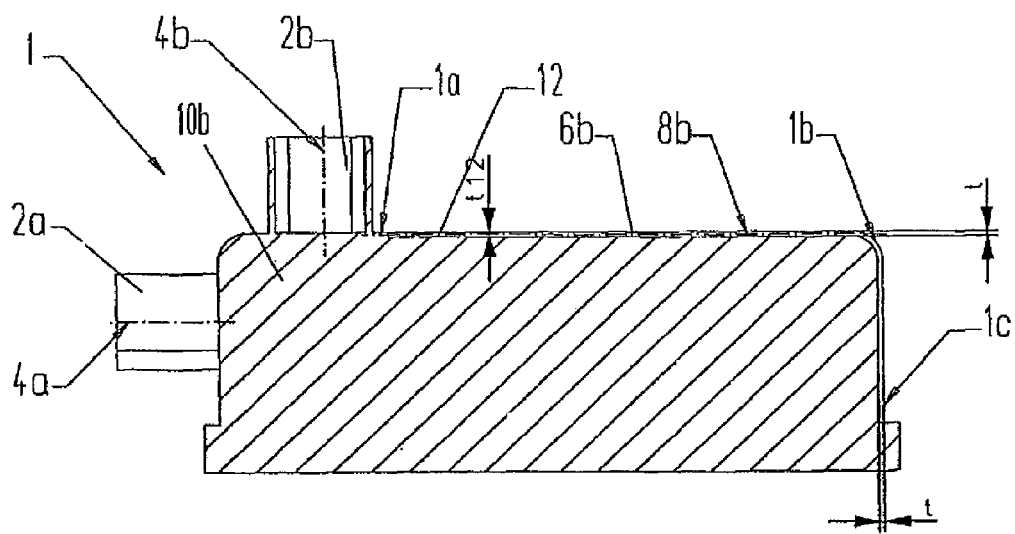
FIG. 2b is another sectional representation of the embodiment of the housing depicted in FIG. 1.

FIG. 2b shows a sectional representation through the housing (1) in FIG. 1 along the second spatial plane (10b). The second longitudinal axis (8b) of the second strip (6b) is oriented perpendicularly to the second plug axis (4b) of the second plug connector (2b), with the result that these two axes (4b, 8b) form a second spatial plane (10b). The second strip (6b) is recessed relative to the housing surface (1a) of the housing (1) by the depth (t). In this case too, part of the second strip (6b) is continued beyond the outline edge (1b) along the housing side (1c), the second strip (6b) also being recessed relative to the surface of the housing side (1c) by the depth (t) in the region of the housing side (1c). The legend (12) takes up only part of the surface of the second strip (6b) and is recessed relative to the housing surface (1a) by the depth (t12).

FIG. 3 shows a housing (1) in a plan view with a first strip (6a) and a first plug connector (2a). The first plug axis (4a) of the first plug connector (2a) is oriented at a predetermined distance parallel to the first longitudinal axis (8a) of the first strip (6a), with the result that these two axes (4a, 8a) form a first spatial plane (10a). The housing (1) has a first side length (l1) and a second side length (l2), which in this case are identical. The first plug connector (2a) has a width (B1), which almost corresponds to the side length (L2). The width (b1) of the first strip (6a) is significantly less than the width (B1) of the first plug connector (2a). Starting from the outline edge (1b) or housing side (1c) on which the first plug connector (2a) is disposed, the first strip (6a) is disposed so as to extend as far as the opposite housing side (1c) or to a distance (d) from the opposite housing side (1c). The first strip (6a) is likewise disposed at a distance (d) from the housing side (1c) or the outline edge (1b) on the longitudinal side of the first strip (6a). The distance (d) preferably corresponds to the width (b1) of the first strip (6a). In the vicinity of the first plug connector (2a), the first strip (6a) has a legend (12). The first strip (6a) can be recessed or raised relative to the housing surface (1a) of the housing (I) or at the same level as the housing surface (1a). The legend (12) is preferably also recessed relative to the surface of the strip (6a) and/or the housing surface (1a).

Figure 4:
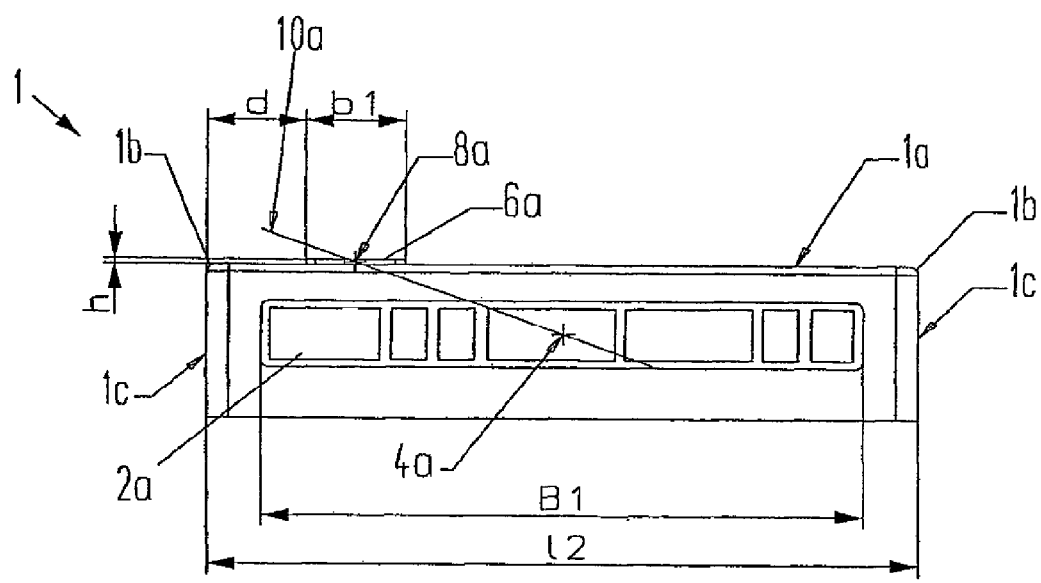
FIG. 4 is a side view of a housing with one strip according to an exemplary embodiment of the present invention.

FIG. 4 shows a side view of the housing in FIG. 3 looking towards the first plug connector (2a). The first strip (6a) is disposed at a distance (d) from the left-hand housing side (1c) at the height (h) relative to the housing surface (1a) of the housing (1). The distance (d) corresponds to the width (b1) of the first strip (6a). The first spatial plane (10a) is formed by the first longitudinal axis (8a) of the first strip (6a), the axis extending in the direction of viewing, and by the first plug axis (4a) of the first strip (2a), the axis extending in the direction of viewing. The width (B1) of the first plug connector (2a) is less than the second side length (l2) and greater than the width (b1) of the first strip (6a).

Figure 5:
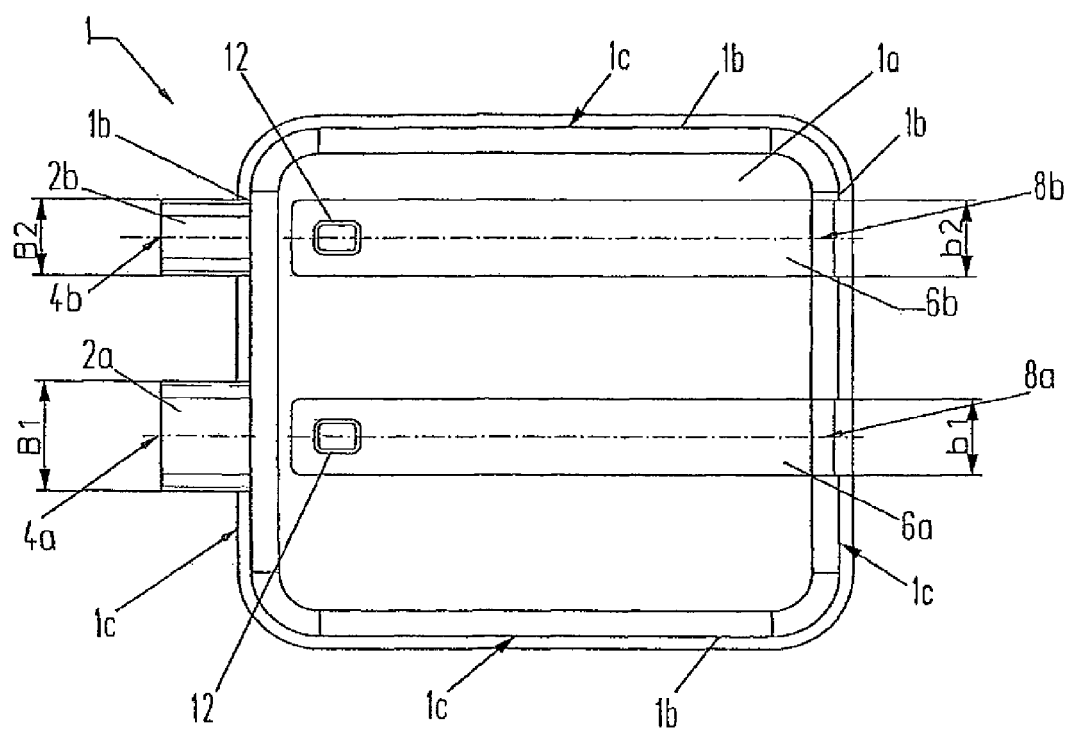
FIG. 5 is a plan view of a housing with two strips and two plug connectors according to an exemplary embodiment of the present invention.

FIG. 5 shows a plan view of a housing (1) with a first plug connector (2a), a first strip (6a) associated with the first plug connector (2a), and a second plug connector (2b) and a second strip (6b) associated with the said second plug connector (2b). The first plug axis (4a) of the first plug connector (2a) extends at a predetermined distance parallel to the first longitudinal axis (8a) of the first strip (6a). The second plug axis (4b) of the second plug connector (2b) extends at a predetermined distance parallel to the second longitudinal axis (8b) of the second plug connector (6b). The second plug connector (2b) has a width (B2), which corresponds to the width (b2) of the second strip (6b). The width (B1) of the first plug connector (2a) is greater than the width (B2) of the second plug connector (2b) and the width (b1) of the first strip (6a). In this case, the width (b1) of the first strip (6a) corresponds to the width (b2) of the second strip (6b), and the maximum width (b1, b2) of the strips (6a, 6b) thus corresponds to the minimum width (B2) of a plug connector (2b, 2a). In the vicinity of the respective plug connector (2a, 2b), each of the strips (6a, 6b) has a legend (12).

Figure 6:
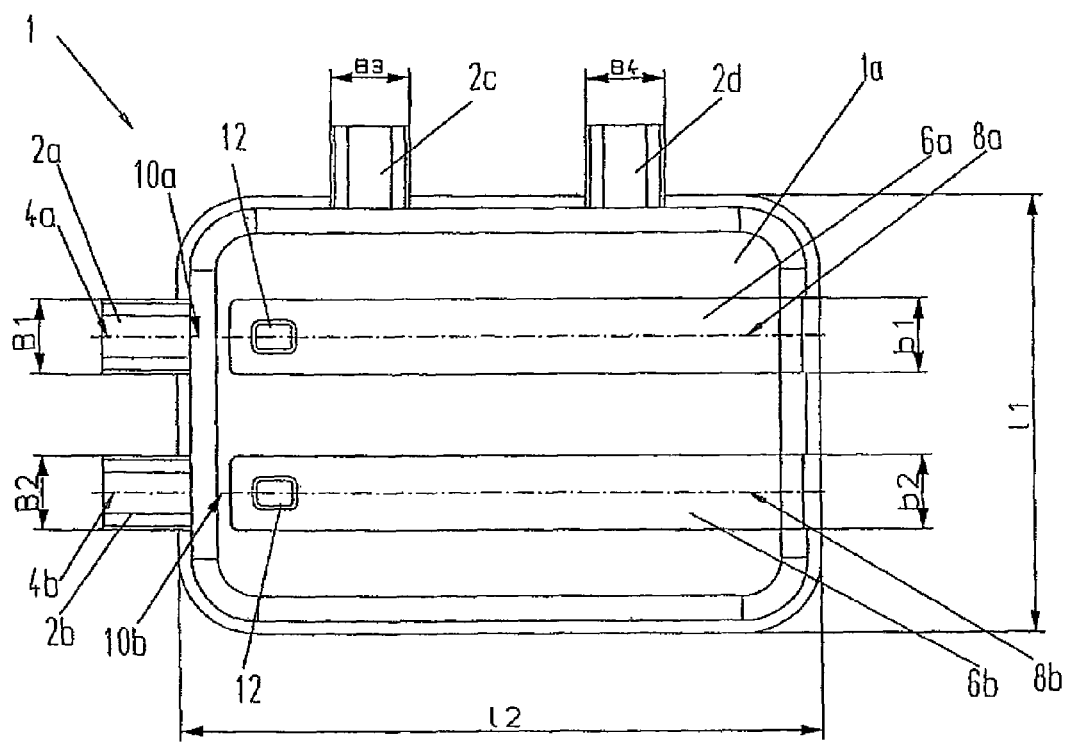
FIG. 6 is a plan view of a housing with two strips and four plug connectors according to an exemplary embodiment of the present invention.

FIG. 6 shows a plan view of a housing (1) with a first plug connector (2a), which has a first plug axis (4a), with a second plug connector (2b), which has a second plug axis (4b), and with a third plug connector (2c) and a fourth plug connector (2d). The first plug connector (2a) and the second plug connector (2b) are disposed on the housing side (1c) with the first side length (l1), which is less than the second side length (l2). In this illustrative embodiment, the first width (B1) of the first plug connector (2a), the second width (B2) of the second plug connector (2b), the third width (B3) of the third plug connector (2c) and the fourth width (B4) of the fourth plug connector (2d) are the same. A first strip (6a) with a first longitudinal axis (8a) is associated with the first plug connector (2a) and the first plug axis (4a). The first plug axis (4a) is disposed at a predetermined distance parallel to the first longitudinal axis (8a), with the result that these two axes (4a, 8a) form a first spatial plane (10a). The width (b1) of the first strip (6a) corresponds to the first width (B1) of the first plug connector (2a). In the region of the first plug connector (2a), the first strip (6a) has a legend (12).

The second strip (6b) with the second longitudinal axis (8b) is associated with the second plug connector (2b) and the second plug axis (4b). Here, the second plug axis (4b) is disposed at a predetermined distance parallel to the second longitudinal axis (8b), with the result that these two axes (4b, 8b) form a second spatial plane (10b). The width (b2) of the second strip (6b) corresponds to the second width (B2) of the second plug connector (2b). The first strip (6a) and the first longitudinal axis (8a) are disposed parallel to the second strip (6b) and the second plug axis (8b). The first longitudinal axis (8a) and the second longitudinal axis (8b) are disposed parallel to the housing side (1c) with the second length (l2), making it possible to dispose a first or second strip (6a, 6b), which is as long and hence as easily visible as possible on the housing surface (1a) of the housing (1).

Figure 7:
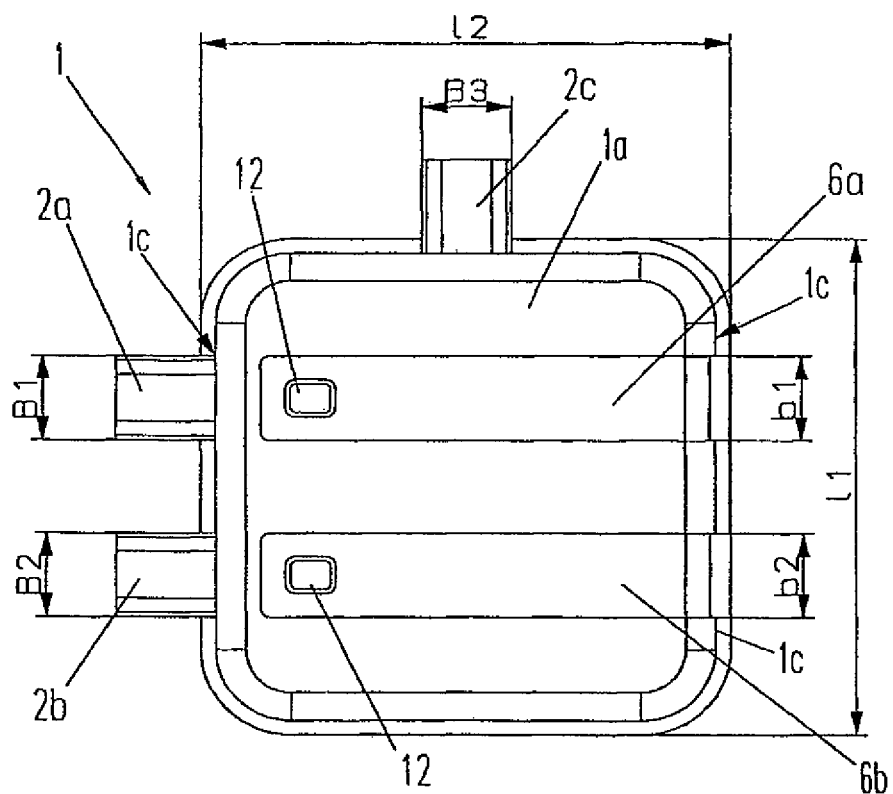
FIG. 7 is a plan view of a housing with two strips and three plug connectors according to an exemplary embodiment of the present invention.

FIG. 7 shows a plan view of a housing (1) with a first plug connector (2a) and a second plug connector (2b) and a third plug connector (2c). The first and the second plug connector (2a, 2b) are disposed on the housing side (1c) with the first side length (l1). The third plug connector (2c) is disposed on the housing side with the second side length (l2). In order, in this case, to obtain a legend and marking of the plug connectors (2a, 2b, 2c) that is as detailed and comprehensive as possible, the strips (6a, 6b) are associated with the plug connectors (2a, 2b) on the housing side (1c) with the higher number of plug connectors (2a, 2b) disposed thereon. A first strip (6a) is associated with the first plug connector (2a), and a second strip (6b) is associated with the second plug connector (2d), as described in the previous figures. In the region of the first plug connector (2a) and of the second plug connector (2b), respectively, both the first strip (6a) and the second strip (6b) have a legend (12), which allows an indication of the function of the respective plug connector (2a, 2b).

Figure 8:
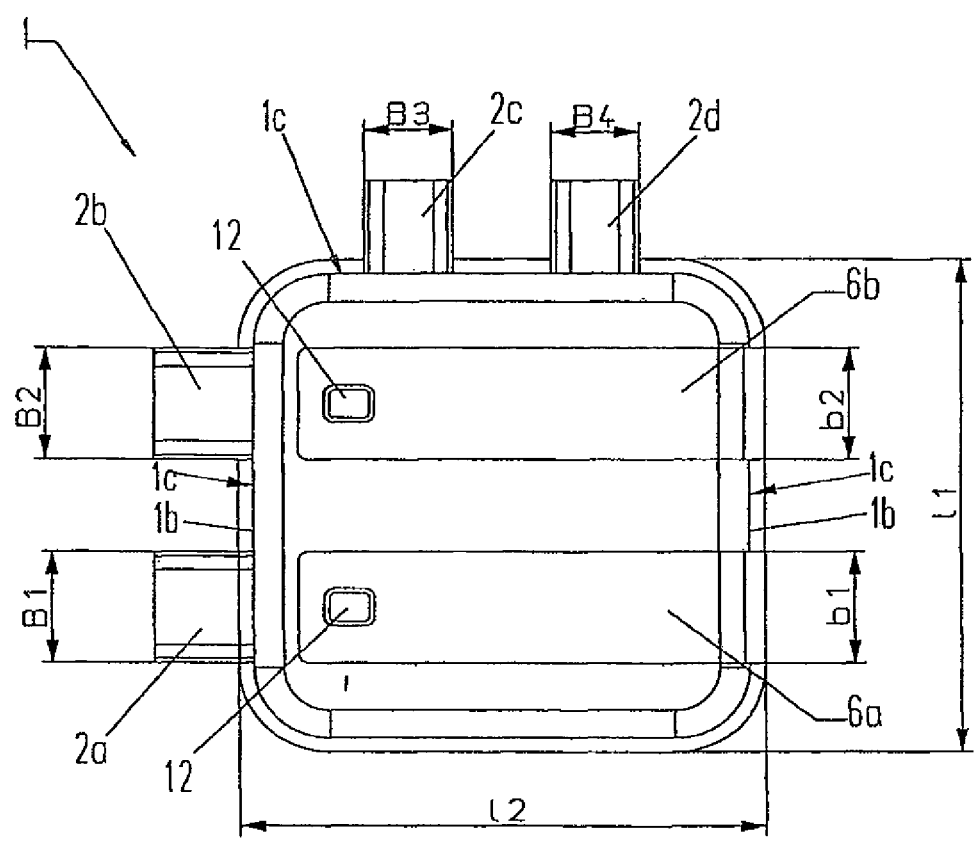
FIG. 8 is a plan view of a housing with two strips and two wide plug connectors and two narrow plug connectors according to an exemplary embodiment of the present invention.

FIG. 8 shows a housing (1) with a first plug connector (2a), a second plug connector (2b), a third plug connector (2c) and a fourth plug connector (2d). The first plug connector (2a) and the second plug connector (2b) are disposed on the housing side (1c) with the first side length (l1). The third plug connector (2c) and the fourth plug connector (2d) are disposed on the housing side (1c) with the second side length (l2). Owing to the fact that the number of plug connectors (2a, 2b, 2c, 2d) is the same on each housing side (1c), the first and second strips (6a, 6b) are associated with the plug connectors (2a, 2b) with the greater width (B1, B2). This has the advantage of improved visibility and recognition. As described in the previous figures, a first strip (6a) is associated with the first plug connector (2a), and a second strip (6b) is associated with the second plug connector (2b). Although the first side length (l1) and the second side length (l2) are identical or equal in this illustrative embodiment, the first strip (6a) and the second strip (6b) are each assigned on the basis of the first width (B1) of the first plug connector (2a) and the second width (B2) of the second plug connector (2d). In this illustrative embodiment, the width (B1) of the first plug connector (2a) and the width (B2) of the second plug connector (2b) are identical and greater than the third width (B3) of the third plug connector (2c) and the fourth width (B4) of the fourth plug connector (2d). The first strip (6a) has a width (b1) that is identical or equal to the first width (B1) of the first plug connector (2a). The width (b2) of the second strip (6b) is also identical or equal to the second width (B2) of the second plug connector (2b). Both the first strip (6a) and the second strip (6b) have a legend (12) in the region of the first plug connector (2a) and of the second plug connector (2b), respectively.

The housing (1) in FIGS. 1 to 8 can be designed as a housing of an electronic unit and/or a pneumatic unit. If the housing (1) is designed for an electronic system, the corresponding plug connectors (2a, 2b, 2c, 2d) are designed as electronic or electric plug connectors. If the housing (1) is designed for a pneumatic unit, e.g., an ABS modulator, the corresponding plug connectors (2a, 2b, 2c, 2d) are pneumatic plug connectors or terminals and designed accordingly.

It will be seen that the objects set forth above, among those made apparent from the preceding description, are efficiently attained, and since certain changes may be made without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention that, as a matter of language, might be said to fall therebetween.

What is claimed is:

1. A housing for a connecting unit, the housing comprising a first plug connector having a first plug axis; a first strip extending from a first surface of the housing to a second surface of the housing adjacent the first surface, the first strip being recessed relative to at least one of the first and second surfaces by a first depth, and having a first longitudinal axis disposed in a first spatial plane with the first plug axis of the first plug connector; a second plug connector having a second plug axis; and a second strip having a second longitudinal axis disposed in a second spatial plane with the second plug axis of the second plug connector, the first and second plug connectors being disposed on different surfaces of the housing.

2. The housing according to claim 1, further comprising a third plug connector, the third plug connector having a third plug axis; and a third strip, a third longitudinal axis of the third strip being disposed in a third spatial plane with the third plug axis of the third plug connector.

3. The housing according to claim 1, wherein the first strip has a surface finish different than a finish of at least one of the first and second surfaces of the housing.

4. The housing according to claim 1, wherein the second strip is raised relative to at least one surface of the housing.

5. The housing according to claim 1, wherein the first strip includes a legend.

6. The housing according to claim 2, wherein the first, second and third strips are parallel to one another.

7. The housing according to claim 2, wherein the first, second and third strips are perpendicular to the first, second and third plug axes, respectively.

8. The housing according to claim 2, wherein the first, second and third strips extend from the second and third plug connectors, respectively, as far as an outline edge of at least one surface of the housing.

9. The housing according to claim 2, wherein the width of the first, second and third strips correspond at the maximum to the width of the first, second and third plug connectors, respectively.

10. The housing according to claim 2, wherein the first, second and third strips have the same width.

11. The housing according to claim 2, wherein the width of the first, second and third strips correspond at the maximum to the minimum width of the first, second and third plug connectors, respectively.

12. The housing according to claim 2, wherein the first, second and third strips are perpendicular to the side of the housing having the greater number of plug connectors.

13. The housing according to claim 2, wherein the first, second and third strips are perpendicular to the side of the housing having the greater width of the first, second and third plug connectors.

14. The housing according to claim 2, wherein the first, second and third strips are parallel to the longest side of the housing.

15. The housing according to claim 1, wherein the first strip is disposed asymmetrically on the housing.

16. The housing according to claim 15, wherein the first strip is at a predefined distance from at an outline edge of at least one of the first and second surfaces of the housing.

17. The housing according to claim 16, wherein the predefined distance corresponds to the width of the first strip.

18. The housing according to claim 1, wherein the first and second plug axes are substantially orthogonal to one another.

19. The housing according to claim 2, wherein the first and third plug axes are substantially parallel to one another and substantially orthogonal to the second plug axis.

20. The housing according to claim 1, wherein the first strip extends from the first surface to the second surface over an outline edge disposed between the first and second surfaces.

21. The housing according to claim 1, wherein the first strip includes a legend that is recessed relative to at least one of the first and second surfaces by a second depth different from the first depth.

22. The housing according to claim 1, wherein the second strip extends from the first surface to the second surface, and is recessed relative to at least one of the first and second surfaces by the first depth.

* * * * *